(12) United States Patent
Hwang

(10) Patent No.: US 11,431,255 B2
(45) Date of Patent: Aug. 30, 2022

(54) ANALYSIS SYSTEM, ANALYSIS METHOD, AND PROGRAM STORAGE MEDIUM

(71) Applicant: NEC CORPORATION, Tokyo (JP)

(72) Inventor: Sangwon Hwang, Tokyo (JP)

(73) Assignee: NEC CORPORATION, Tokyo (JP)

(*) Notice: Subject to any disclaimer, the term of this patent is extended or adjusted under 35 U.S.C. 154(b) by 159 days.

(21) Appl. No.: 16/634,658

(22) PCT Filed: Aug. 2, 2018

(86) PCT No.: PCT/JP2018/028970
§ 371 (c)(1),
(2) Date: Jan. 28, 2020

(87) PCT Pub. No.: WO2019/026985
PCT Pub. Date: Feb. 7, 2019

(65) Prior Publication Data
US 2020/0204724 A1    Jun. 25, 2020

(30) Foreign Application Priority Data

Sep. 28, 2017  (JP) .............................. JP2017-188647

(51) Int. Cl.
*H02M 7/00* (2006.01)
*H04N 5/232* (2006.01)
(Continued)

(52) U.S. Cl.
CPC ............ *H02M 7/003* (2013.01); *H01L 23/50* (2013.01); *H01L 23/52* (2013.01); *H01L 25/07* (2013.01);
(Continued)

(58) Field of Classification Search
CPC ........ G08B 13/19608; G08B 13/19645; H04N 5/23206; H04N 5/23218
See application file for complete search history.

(56) References Cited

U.S. PATENT DOCUMENTS 6,693,533 B2 * 2/2004 Ebata ............... G08B 13/19656
340/506
9,313,463 B2 * 4/2016 Sarhan ............. G08B 13/19645
(Continued)

FOREIGN PATENT DOCUMENTS

CN    102754436 A   * 10/2012   ......... H04N 5/23299
CN    106412414 A   *  2/2017
(Continued)

OTHER PUBLICATIONS

International Search Report for PCT/JP2018/028970 dated Sep. 25, 2018 (PCT/ISA/210).
(Continued)

*Primary Examiner* — John Villecco

(57) ABSTRACT

In order to provide a feature for processing an image of an object being photographed using photographic data having better quality, an image analyzer 1 is provided with a selection unit 104 and a bandwidth control request unit 105. The selection unit 104 selects a second photographing device associated with a first photographing device from among a plurality of photographing devices. The bandwidth control request unit 105 transmits, to a network control device, a request for change of the transmission data amount transmittable by the second photographing device.

8 Claims, 9 Drawing Sheets

(51) Int. Cl.
*H04N 5/247* (2006.01)
*H01L 23/50* (2006.01)
*H01L 23/52* (2006.01)
*H01L 25/07* (2006.01)
*H01L 25/18* (2006.01)
*H01L 27/06* (2006.01)
*H01L 27/07* (2006.01)
*H01L 29/66* (2006.01)
*H01L 25/11* (2006.01)

(52) U.S. Cl.
CPC .............. *H01L 25/11* (2013.01); *H01L 25/18* (2013.01); *H01L 27/0623* (2013.01); *H01L 27/0635* (2013.01); *H01L 27/0711* (2013.01); *H01L 29/66325* (2013.01); *H04N 5/23206* (2013.01); *H04N 5/247* (2013.01); *H01L 2924/13055* (2013.01); *H01L 2924/30107* (2013.01)

(56) References Cited

U.S. PATENT DOCUMENTS

| | | | | |
|---|---|---|---|---|
| 10,681,312 | B2* | 6/2020 | Gali | H04N 7/181 |
| 11,019,268 | B2* | 5/2021 | Ida | H04N 5/247 |
| 2004/0156530 | A1* | 8/2004 | Brodsky | G06V 10/24 |
| | | | | 382/103 |
| 2004/0252194 | A1* | 12/2004 | Lin | H04N 7/181 |
| | | | | 348/169 |
| 2005/0018766 | A1* | 1/2005 | Iwamura | G08B 13/19656 |
| | | | | 375/240.01 |
| 2009/0204707 | A1* | 8/2009 | Kamegaya | H04L 67/125 |
| | | | | 709/224 |
| 2010/0245588 | A1* | 9/2010 | Waehner | G01S 13/74 |
| | | | | 348/169 |
| 2011/0069173 | A1* | 3/2011 | Hazzani | H04N 21/21805 |
| | | | | 348/159 |
| 2012/0133774 | A1* | 5/2012 | Sarhan | G08B 13/19656 |
| | | | | 348/159 |
| 2015/0244928 | A1* | 8/2015 | Jo | H04N 5/23216 |
| | | | | 348/211.4 |
| 2016/0050396 | A1* | 2/2016 | Gali | H04N 7/181 |
| | | | | 348/159 |
| 2016/0094810 | A1* | 3/2016 | Mirza | H04L 67/125 |
| | | | | 348/159 |
| 2016/0127695 | A1* | 5/2016 | Zhang | H04N 7/185 |
| | | | | 348/143 |
| 2016/0182849 | A1* | 6/2016 | Wakao | H04N 7/18 |
| | | | | 348/333.04 |
| 2016/0189500 | A1* | 6/2016 | Kim | G08B 13/19645 |
| | | | | 386/223 |
| 2016/0261808 | A1 | 9/2016 | Tojo | |
| 2016/0373639 | A1* | 12/2016 | Westmacott | G01S 5/0027 |
| 2017/0091561 | A1* | 3/2017 | Pham | G06V 40/103 |
| 2017/0208355 | A1* | 7/2017 | Bogucki | H04N 21/44218 |
| 2019/0191098 | A1* | 6/2019 | Ishii | H04N 5/23299 |

FOREIGN PATENT DOCUMENTS

| | | | | |
|---|---|---|---|---|
| JP | 2000-358240 | A | | 12/2000 |
| JP | 2011061583 | A * | 3/2011 | ............. H04N 7/181 |
| JP | 2011-151459 | A | | 8/2011 |
| JP | 2015002553 | A * | 1/2015 | |
| JP | 2016-163328 | A | | 9/2016 |
| JP | 2016-187176 | A | | 10/2016 |
| JP | 2017157963 | A * | 9/2017 | |
| JP | 2018093401 | A * | 6/2018 | |
| KR | 20100013855 | A * | 2/2010 | |
| KR | 20120124785 | A * | 11/2012 | |

OTHER PUBLICATIONS

Written Opinion of the International Searching Authority for PCT/JP2018/028970 dated Sep. 25, 2018 (PCT/ISA/237).

* cited by examiner

Fig. 4

IMAGING DEVICE INFORMATION TABLE

| IMAGING DEVICE ID | LATITUDE | LONGITUDE | ALTITUDE | IMAGE-CAPTURING DIRECTION | IMAGE-CAPTURING ANGLE | SUBSCRIBER ID | IMAGE-CAPTURING SCOPE | DEVICE TYPE |
|---|---|---|---|---|---|---|---|---|
| Camera1 | 35° 38' 51" N | 139° 44' 54" E | 2.7 | NNE | 95° | 79261234567 | Area1 | Fixed |
| Camera2 | 35° 38' 51" N | 139° 44' 56" E | 2 | NNE | 95° | 79261234445 | Area2 | Fixed |
| Camera3 | 35° 38' 51" N | 139° 44' 59" E | 2.5 | NNE | 95° | 79261234575 | Area3 | Patrol car |
| Camera4 | 35° 38' 12" N | 139° 39' 35" E | 4.3 | NbE | 78° | 79261233322 | Area4 | Drone |

Fig. 5
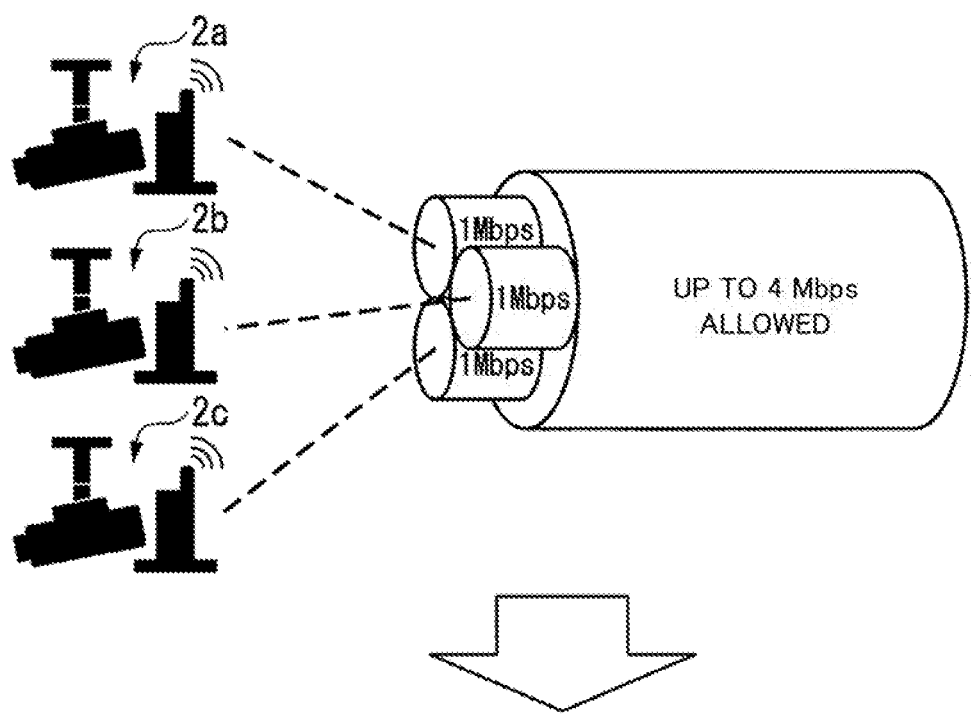
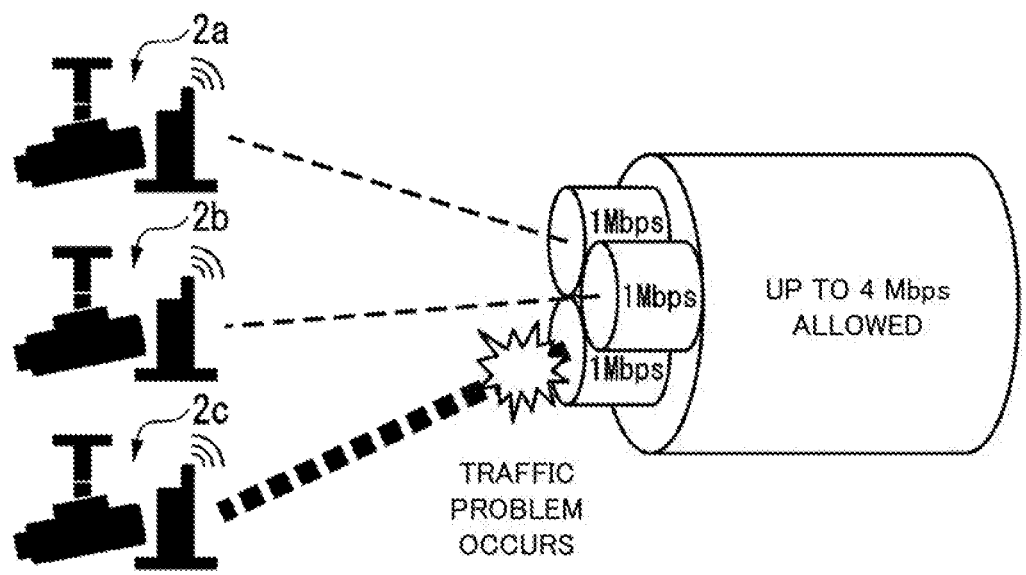

ANALYSIS SYSTEM, ANALYSIS METHOD, AND PROGRAM STORAGE MEDIUM

CROSS REFERENCE TO RELATED APPLICATIONS

This application is a National Stage of International Application No. PCT/JP2018/028970 filed Aug. 2, 2018, claiming priority based on Japanese Patent Application No. 2017-150590, filed Aug. 3, 2017, the disclosure of which is incorporated herein in its entirety.

TECHNICAL FIELD

The present invention relates to a technology related to data volume control at a time of transmitting a captured image from an imaging device to an analyzer.

BACKGROUND ART

Many technologies for monitoring an image-capturing target by using an imaging device such as a camera are in use. In monitoring an image-capturing target, an image analyzer such as a server monitors the image-capturing target by processing images included in image-capturing data acquired from the imaging device. For example, when the image-capturing target is a person, whether the individual on the images included in the image-capturing data is a suspicious person or not is determined. As a related technology, PTL 1 discloses a technology for an object identification device. The object identification device in PTL 1 is connected with a plurality of imaging devices and selects one imaging device from among the plurality of imaging devices by using the information on the positions of the object included in the videos captured by the imaging devices. The object identification device outputs a command to the selected imaging device to increase at least one of the image-capturing frame rate and the image quality of the selected imaging device. This technology described in PTL 1 curtails deterioration of the accuracy of object identification by the object identification device connected with the imaging devices as well as the increase of the network load.

CITATION LIST

Patent Literature

[PTL 1] Japanese Unexamined Patent Application Publication No. 2016-163328 A.

SUMMARY OF INVENTION

Technical Problem

According to the above-described technology, however, when the data transmission volume per unit time authorized for the imaging device that transmits the image-capturing data is constant, the device at the transmission destination may be unable to receive high quality image-capturing data because of, for example, network congestion. Further, when it is required to perform image processing of the image-capturing target more accurately, an arrangement that allows for the reception of the image-capturing data of high image quality from a plurality of imaging devices that capture the image-capturing target while curtailing the cost.

An object of the present invention is therefore to provide a technology for solving the above-described problem. In other words, a main object of the present invention is to provide a communication technology that enables image processing of an image-capturing target using image-capturing data of higher quality.

Solution to Problem

An analyzer recited in the present invention, as an aspect, includes:

a selection unit that selects a second imaging device relating to a first imaging device from among a plurality of imaging devices; and a band control request unit that transmits to a network control device an alteration request to alter a data transmission volume authorized for the second imaging device.

An analysis system recited in the present invention, as an aspect, includes:

a plurality of image-capturing unit that transmits image-capturing data;

a selection unit that selects a second image-capturing unit relating to a first image-capturing unit from among the plurality of image-capturing unit; and an analyzing unit that transmits an alteration request to alter a data transmission volume authorized for the second image-capturing unit.

An analysis method recited in the present invention, as an aspect, includes:

selecting a second imaging device relating to a first imaging device from among a plurality of imaging devices; and transmitting to a network control device an alteration request to alter a data transmission volume authorized for the second imaging device.

A program storage medium recited in the present invention, as an aspect, stores a computer program that causes a computer of an analyzer to function as:

a selection unit that selects a second imaging device relating to a first imaging device from among a plurality of imaging devices; and a band control request unit that transmits to a network control device an alteration request to alter a data transmission volume authorized for the second imaging device.

Advantageous Effects of Invention

According to the present invention, it is possible to perform image processing of an image-capturing target using image-capturing data of higher quality.

BRIEF DESCRIPTION OF DRAWINGS

FIG. 4 is a table illustrating an example of information stored in a database.

FIG. 5 is a first diagram schematically illustrating a transmission of image-capturing data from imaging devices.

EXAMPLE EMBODIMENT

An analysis system including an analyzer according to an example embodiment of the present invention will be described below with reference to the drawings.

Figure 1:
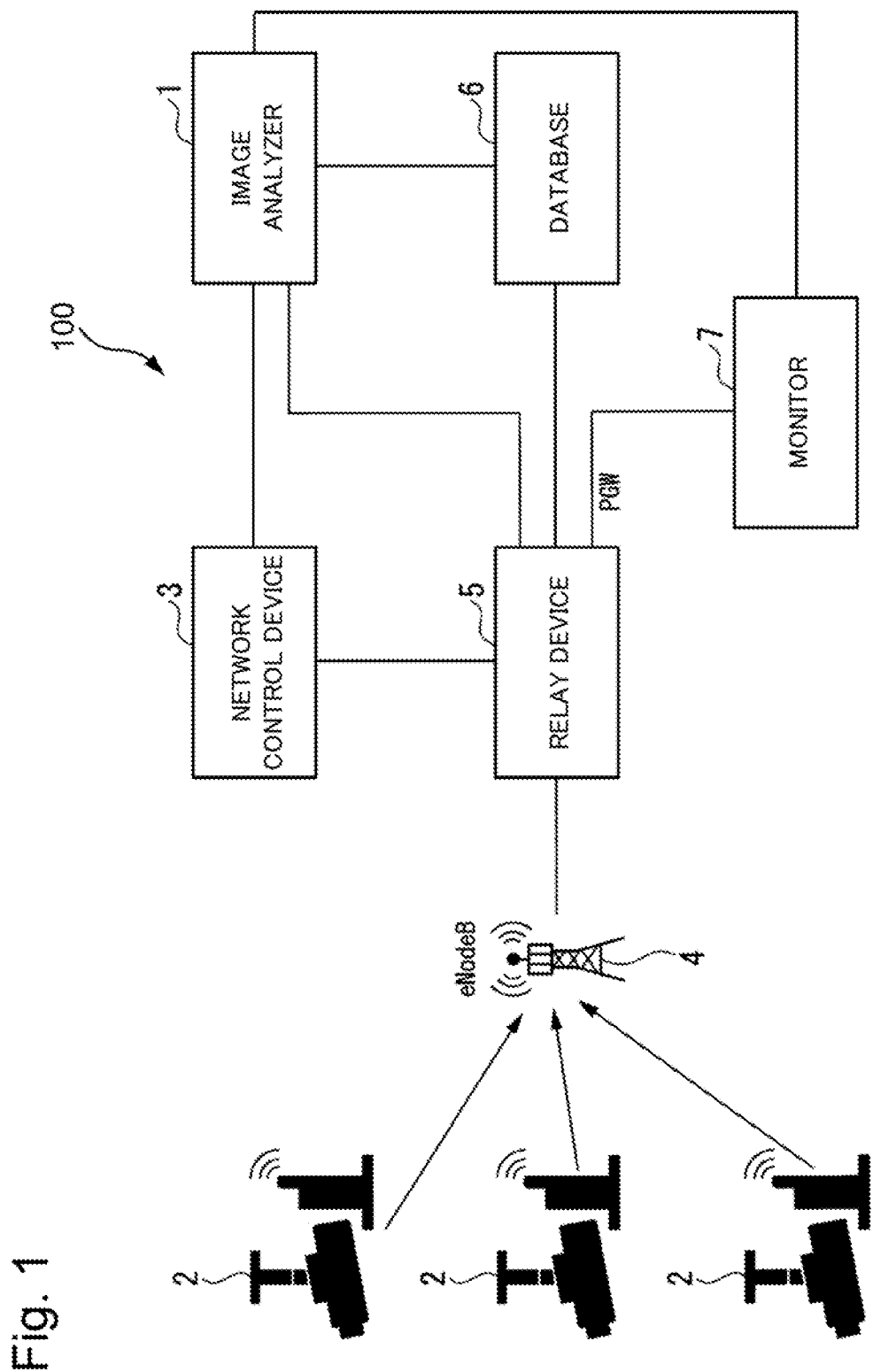
FIG. 1 is a diagram illustrating an example configuration of an image analysis system.

FIG. 1 is a diagram illustrating a configuration of an analysis system including an image analyzer, which is an analyzer according to an example embodiment of the present invention. The analysis system according to this example embodiment is an image analysis system that analyzes images. The image analysis system 100 is configured to include an image analyzer 1, imaging devices 2, a network control device 3, a base station 4, a relay device 5, a database 6, and a monitor 7.

The image analyzer 1 is configured to analyze images included in the image-capturing data received from the imaging device 2.

The imaging devices 2 are, for example, cameras installed on streets in large numbers. The imaging devices 2 may be attached to flying objects such as drones, patrol cars, and the like and may move. The imaging devices 2 are connected with the image analyzer 1 via the base station 4 and the relay device 5, which are connected with a public wireless network or a communication network such as the Internet.

The network control device 3 is configured to control the data transmission volume per unit time (data traffic) that the relay device 5 allows the imaging devices 2. For example, the network control device 3 controls data traffic by Policy and Charging Rules Function (PCRF), one of data communication control techniques.

The base station 4 is a wireless base station device in a predetermined wireless communication system. The base station 4 is, for example, an evolved Node B (eNodeB), which is a wireless base station adapted to wireless communication based on Long Term Evolution (LTE).

The relay device 5 is a network device that relays data from one communication network to another communication network. The relay device 5 is, for example, a Packet Data Network Gateway (P-GW). The relay device 5 performs communication with the imaging devices 2 via the base station 4 based on the data transmission volume per unit time allowed for the imaging devices 2.

The database 6 is a storage device that stores various information from the image analyzer 1.

The monitor 7 is a display unit that displays images and videos of the image-capturing data of the imaging devices 2 selected by the image analyzer 1 and capable of displaying real time images and videos of the image-capturing data of the imaging device 2.

Figure 2:
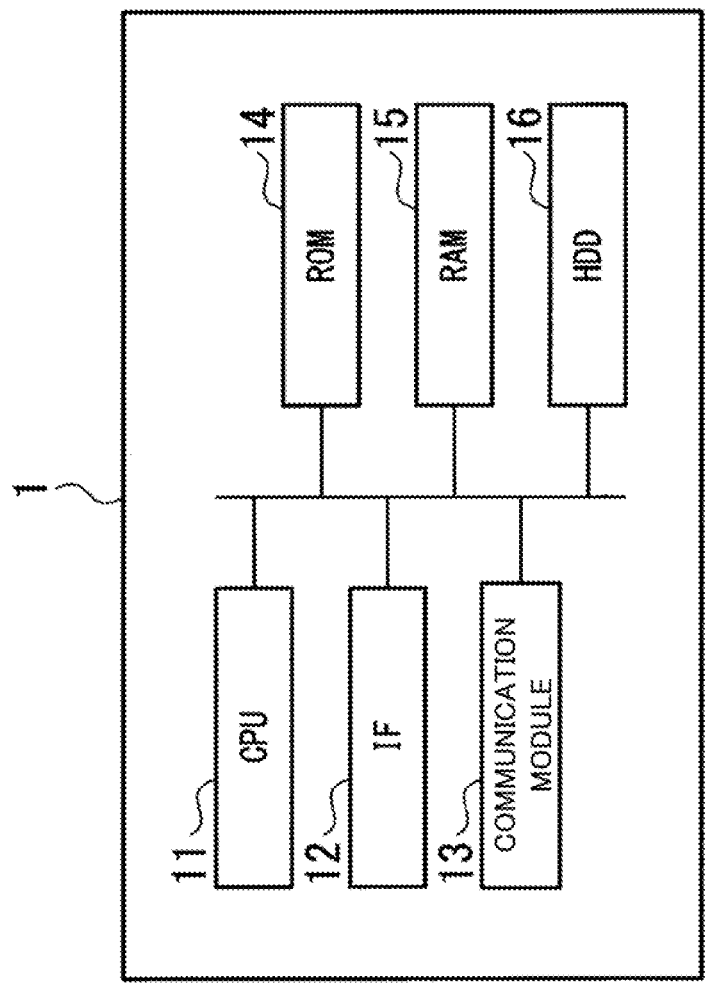
FIG. 2 is a diagram illustrating an example hardware configuration of an image analyzer.

FIG. 2 is a diagram illustrating an example of hardware configuration of the image analyzer 1.

The image analyzer 1 in FIG. 2 is a computer including a central processing unit (CPU) 11, an interface (IF) 12, a communication module 13, a read only memory (ROM) 14, a random access memory (RAM) 15, a hard disk drive (HDD) 16, and the like.

Figure 3:
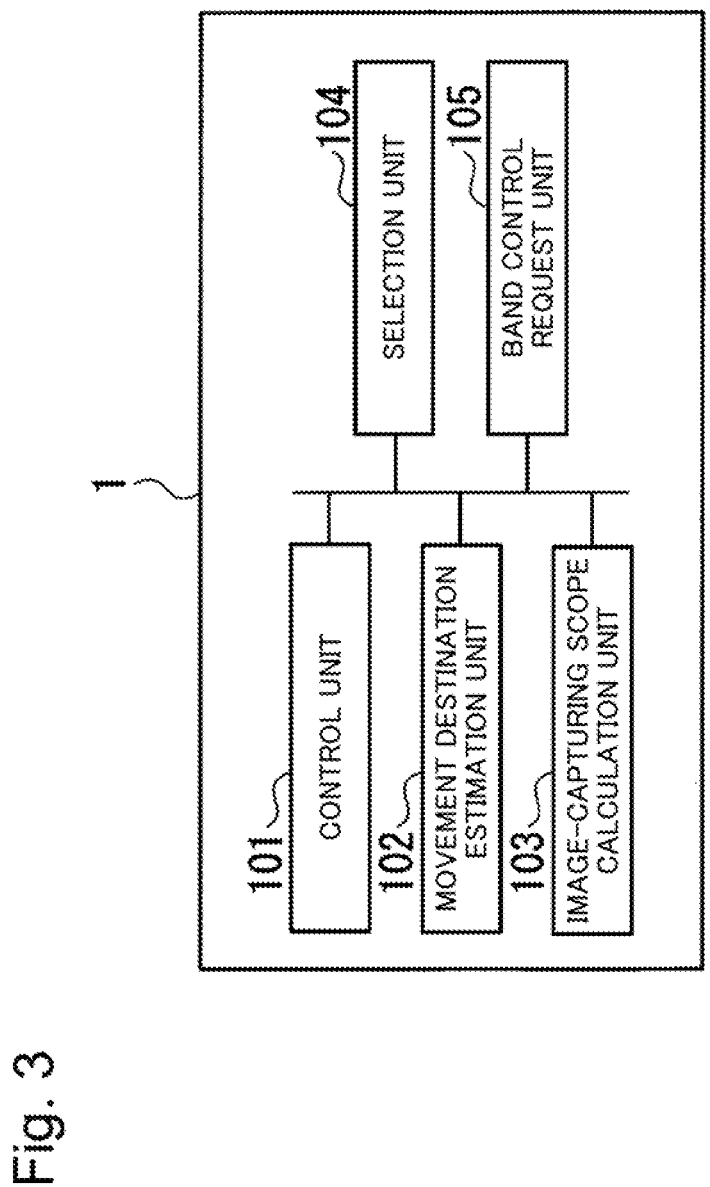
FIG. 3 is a block diagram for describing an example of the function of the image analyzer.

FIG. 3 is a block diagram illustrating a functional configuration of the image analyzer 1.

The CPU 11 of the image analyzer 1 executes computer programs stored in the storage unit such as the ROM 14 and thereby performs functions represented by such functional units as a control unit 101, a movement destination estimation unit 102, an image-capturing scope calculation unit 103, a selection unit 104, and a band control request unit 105.

The control unit 101 controls the other functional units.

The movement destination estimation unit 102 estimates the movement destination of an image-capturing target based on the movement direction of the image-capturing target depicted in the image-capturing data received from a first imaging device 2. The first imaging device 2 is, for example, the imaging device 2 that captured the predetermined image-capturing target earlier than any other of the plurality of imaging devices 2 included in the image analysis system 100.

The image-capturing scope calculation unit 103 calculates respective image-capturing scopes for the imaging devices 2 based on the position information of the imaging devices 2 and the image-capturing directions of the imaging devices 2.

The selection unit 104 selects a second imaging device 2 relating to the first imaging device 2. The second imaging device 2 is, for example, an imaging device 2 that is likely to capture the predetermined image-capturing target after the first imaging device 2 among the plurality of imaging devices 2 included in the image analysis system 100. For example, the selection unit 104 selects a second imaging device 2 based on the estimation result of the movement destination of the image-capturing target. Alternatively, the selection unit 104 may select a second imaging device 2 located on a position from which the image-capturing scope thereof includes the movement destination of the image-capturing target based on the estimation result of the movement destination of the image-capturing target. A selection rule to select a second imaging device 2 is established in advance and given to the selection unit 104 in this manner and the selection unit 104 selects a second imaging device 2 in accordance with the selection rule.

The band control request unit 105 transmits to the network control device 3 an increase request (alteration request) for increasing the data transmission volume per unit time allowed for the second imaging device 2 in the network through which the image-capturing data is transmitted from the second imaging device 2 to the image analyzer 1.

The image analyzer 1 having the above-described function analyzes the movement line of a person such as a suspicious person in the image-capturing scope of an imaging device 2 and increases in advance the data transmission volume per unit time allowed for the second imaging device 2 located at the predicted movement destination before the person moves thereto. More specifically, in the image analysis system 100 including the image analyzer 1, an imaging device 2 capturing a person such as a suspicious person and a plurality of imaging devices 2 capturing candidate sites of predicted movement destinations of the person are connected with the image analyzer 1. Among the plurality of imaging devices 2 capturing candidate sites of predicted movement destinations, the image analyzer 1 selects an imaging device 2 that captures the area most likely to cover the movement destination of the suspicious person or the like who is the image-capturing target. In short, the image analyzer 1 selects an imaging device 2 capable of capturing in the future the person such as a suspicious person or the like who is the image-capturing target. The image analyzer 1 then performs control so as to increase the data transmission volume per unit time allowed for that imaging device 2.

With such processing, the image analyzer 1 can perform control so as to increase in advance the data transmission volume per unit time for the imaging device 2 located at the movement destination of a person such as a suspicious person. Thus, for example, even when the suspicious person is moving on a motorcycle or the like, the image analysis system 100 can allow the imaging device 2 at the movement destination to transfer high-definition image-capturing data quickly to a transfer destination such as the image analyzer 1.

FIG. 4 is a table for describing information related to the imaging device 2 and stored in the database 6.

As illustrated in FIG. 4, the database 6 stores imaging device identification (ID), position information of the imaging devices (latitude, longitude, altitude), image-capturing directions, image-capturing angles, subscriber identification (ID), image-capturing scopes, and device types, which are associated with each other.

The imaging device IDs and the position information of the imaging devices 2 are information transmitted by the imaging device 2 to the image analyzer 1 and stored by the image analyzer 1 in the database 6. For example, each imaging device 2 has a Global Positioning System (GPS) function and calculates its position information based on the signal received from the GPS satellites, using the GPS function thereof and transmits the position information as well as information on the imaging device ID and device type, stored in advance in a storage unit such as a memory to the image analyzer 1. Alternatively, the position information of the imaging devices 2 may be inputted and set up in the imaging device 2 manually by the administrator. Further, the imaging devices 2 may include, for example, a geomagnetic sensor or acceleration sensor and transmit information of the image-capturing direction detected based on a value detected by the geomagnetic sensor and the image-capturing angle detected by the acceleration sensor to the image analyzer 1. The image analyzer 1 stores the pieces of information received from the imaging device 2 in the database 6, the pieces of information being associated with each other. Further, the image analyzer 1 may receive subscriber IDs (identification information used when accessing the communication network) and store the subscriber IDs in the database 6, the imaging device IDs being further associated with the subscriber IDs.

An image-capturing scope is, for example, defined by a plurality of pieces of information indicating latitude, longitude, and altitude. The image-capturing scope information is a piece of information calculated by the image analyzer 1 based on the position information, the image-capturing direction, and the image-capturing angle of each imaging device 2. Alternatively, the administrator may input image-capturing scope information to the image analyzer 1. The image analyzer 1 may further use information such as the focal length of each imaging device 2 in calculating the image-capturing scope and may calculate the image-capturing scope by, for example, substituting these values in a formula for calculating the image-capturing scope. Note that the calculation of the image-capturing scope need not be done by the image-capturing scope calculation unit 102, and image-capturing scope information executed and calculated by a device external to the image analysis system 100 may be inputted to the image analyzer 1.

The device type information indicates information, for example, whether the imaging devices 2 are fixed, installed in patrol cars or drones, or wearable and worn by people, or the like. When the device type of an imaging device 2 indicates a patrol car or a drone, the position information of the imaging device 2 is frequently updated. The image analyzer 1 may determine based on the device type, an imaging device 2 of which the position information is to be frequently updated and may transmit a checking request to the imaging device 2 in order to check the image-capturing conditions. In response to the checking request to check the image-capturing conditions, the imaging device 2 transmits image-capturing conditions information including the position information, the image-capturing direction, the image-capturing angle, and the like to the image analyzer 1. The image analyzer 1 repeatedly calculates the image-capturing scope, using the position information, the image-capturing direction, the image-capturing angle, and the like included in the image-capturing conditions information. In other words, the image analyzer 1 may perform different kinds of processing depending on the device types.

FIG. 5 is a first diagram schematically illustrating a transmission of image-capturing data from imaging devices.

In FIG. 5, three imaging devices 2a, 2b and 2c are respectively allowed a data transmission volume of 1 Mbps by the network carrier. Further, the three imaging devices 2a, 2b and 2c are imaging devices 2 administered by the administrator, who is a security company or the like. Here, the network carrier allows a total data transmission volume of 4 Mbps for the transmission of data from the imaging devices 2a, 2b and 2c to the image analyzer 1. It is assumed that in this situation one of the imaging devices 2 tries to transmit a high quality image as it has managed to capture the predetermined image-capturing target. However, since it takes time to increase the data transmission volume per unit time over the allowed volume, it is conceivable that the imaging device 2 cannot transmit image-capturing data of high image quality before the image-capturing target goes out of sight, due to a traffic problem arising from the designated allowance of the data transmission volume. Allowing a greater data transmission volume per unit time respectively for the imaging devices 2a, 2b and 2c in advance in consideration for such a situation would increase the cost for continuously securing the band for transmitting such a volume of data.

Figure 6:
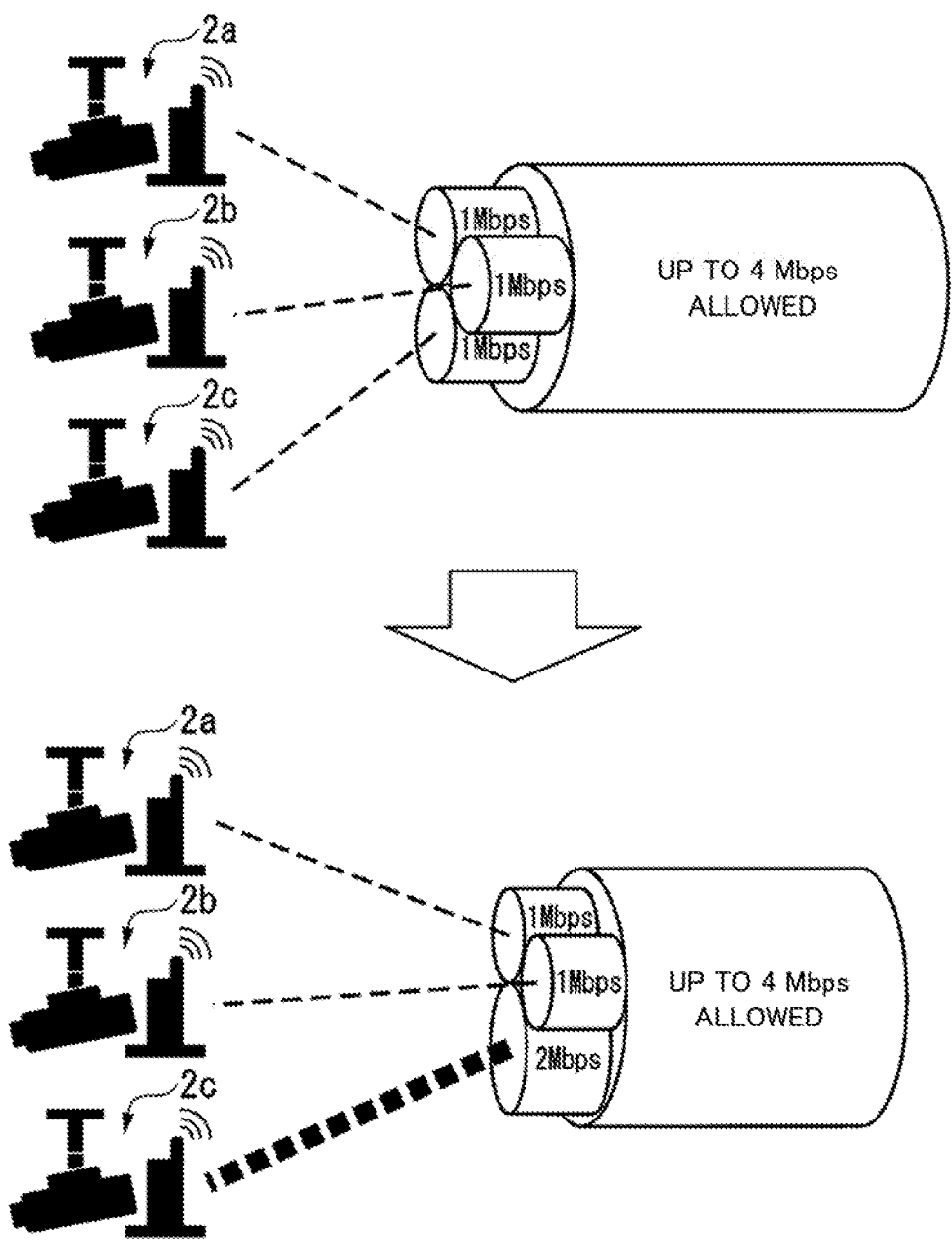
FIG. 6 is a second diagram schematically illustrating a transmission of image-capturing data from imaging devices.

FIG. 6 is a second diagram schematically illustrating a transmission of image-capturing data from imaging devices.

FIG. 6 also depicts the imaging devices 2a, 2b and 2c. In the image analysis system 100 including the image analyzer 1 according to the present example embodiment, when the imaging device 2a has managed to capture the predetermined image-capturing target, the image analyzer 1 selects the imaging device 2b or the imaging device 2c, estimated to be at the movement destination of the image-capturing target. For example, when the imaging device 2c is selected as the imaging device 2 estimated to be at the movement destination, the image analyzer 1 performs control to increase the image-capturing data transmission volume per unit time allowed for the imaging device 2c from 1 Mbps to 2 Mbps.

Figure 7:
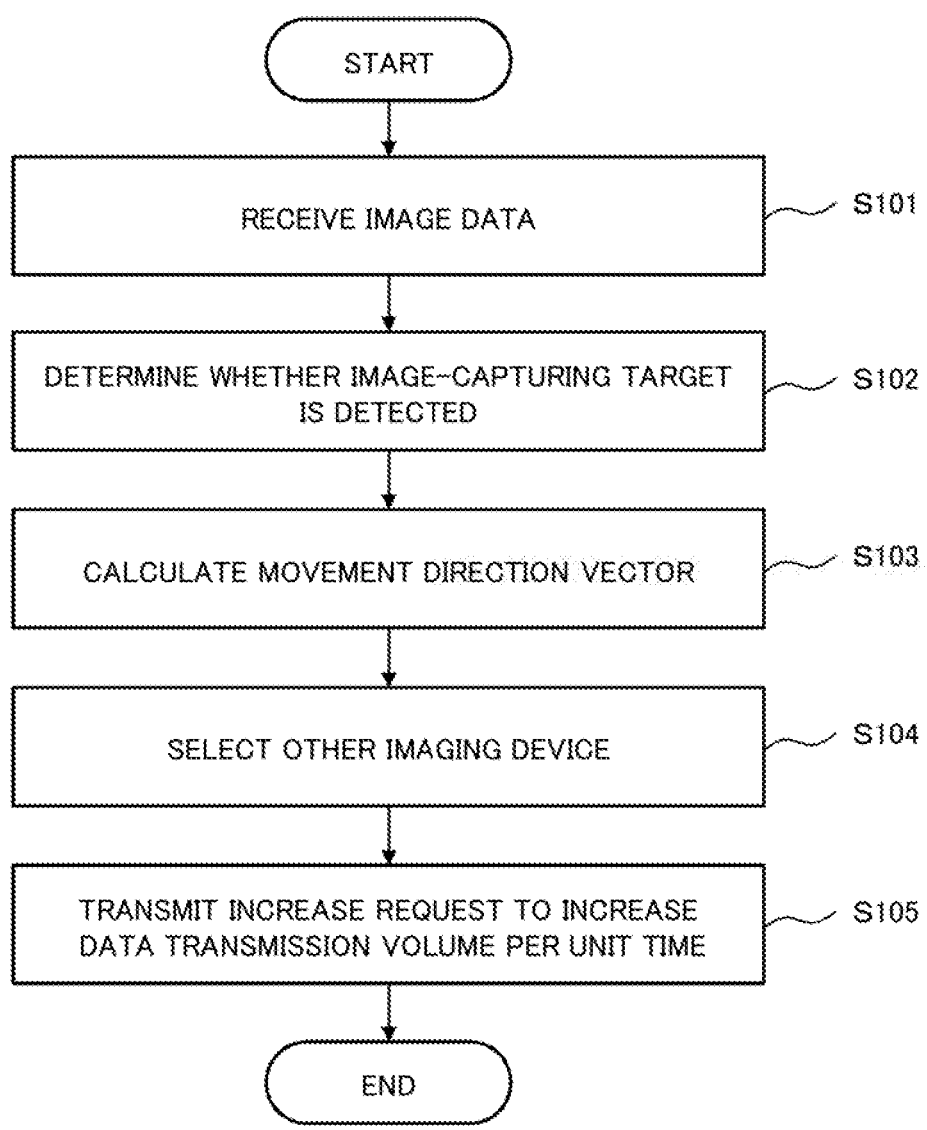
FIG. 7 is a flowchart illustrating an example of processing by the image analyzer.

FIG. 7 is a flowchart illustrating the processing by the image analyzer.

Next, the image analysis processing performed by the image analyzer 1 in cooperation with other devices will be described.

It is assumed that the database 6 stores in advance the image-capturing conditions information relating to the imaging devices 2 as described above. Further, the image analyzer 1 repeatedly receives the image-capturing conditions information including the position information, the image-capturing directions, the image-capturing angles and the like from the imaging devices 2. Still further, the image analyzer 1 determines whether or not the position information, the image-capturing directions, and the image-capturing angle information included in the image-capturing conditions information received from the imaging device 2 match the information stored in the database 6. Yet still further, when they do not match, the image analyzer 1 updates the information stored in the database 6 with the information newly received from the imaging device 2.

When the image-capturing conditions information is updated, the image-capturing scope calculation unit 103 calculates the image-capturing scope by substituting the updated position information, image-capturing directions, and image-capturing angles to the formula for calculating the image-capturing scope. The image-capturing scope calculation unit 103 updates the image-capturing scope information stored in the database 6. The image analyzer 1 updates the information as described above every time the image analyzer 1 receives image-capturing conditions information from the imaging devices 2.

In this situation, the imaging devices 2 transmit image-capturing data to the image analyzer 1. The transmission volume of the image-capturing data per unit time is recorded by the relay device 5. The relay device 5 performs session management in relation to the imaging devices 2 and thereby the image-capturing data of the imaging devices 2 are transmitted within the limit of image-capturing data transmission volume per unit time respectively allowed for the imaging devices 2. The image analyzer 1 receives the image-capturing data (Step S101). The image movement destination estimation unit 102 of the image analyzer 1 analyzes the images included in the image-capturing data received from the imaging devices 2 and determines whether or not a person who is the image-capturing target is detected (Step S102).

Note that the imaging devices 2 may identify the behavior of a person who is the image-capturing target or identify the person who is the image-capturing target and may determine based on the result, whether or not the person is the suspicious person who is the image-capturing target. Further, the image-capturing target is not necessarily be a person. The image-capturing target may be, for example, a vehicle such as a car, a bicycle, and a motorcycle, an animal, and an object in a suspicious motion (a cardboard box worn by a suspicious person, a stick placed from outside the image-capturing scope of an imaging device 2, and the like).

The movement destination estimation unit 102 selects the imaging device 2 that is the transmission source of the image-capturing data that include the image from which the person has been detected and are being processed from among the plurality of imaging devices 2 connected to the image analyzer 1. The movement destination estimation unit 102 reads image-capturing conditions information of the imaging device 2 that is the transmission source, from the information on the imaging devices stored in the database 6. The movement destination estimation unit 102 estimates the movement direction of the detected person.

Figure 8:
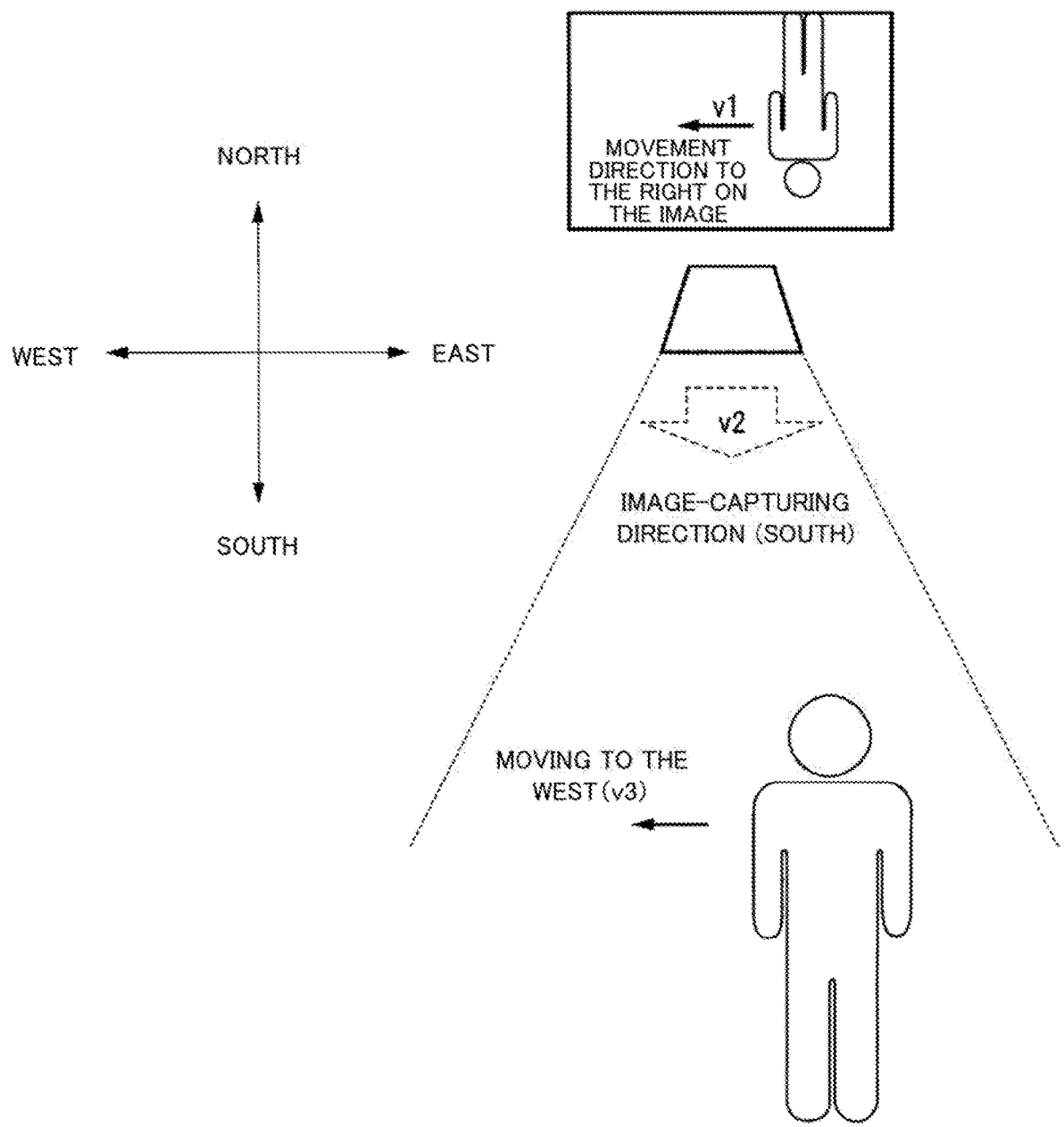
FIG. 8 is a schematic diagram illustrating an estimation of a movement direction.

FIG. 8 is a diagram schematically illustrating an estimation of a movement direction.

For example based on the positions of a person depicted on a plurality of sequential images included the image-capturing data, the movement destination estimation unit 102 calculates a movement vector on image (v1), which indicates the movement direction of the person on the images indicated by the image-capturing data. Further, the movement destination estimation unit 102 calculates a movement direction vector in real space (v3) that corresponds to the movement vector on image (v1), by using the image-capturing direction (v2) included in the image-capturing conditions information of the imaging device 2 that is the transmission source of the image-capturing data (Step S103). For example, as illustrated in FIG. 8, when the image-capturing direction (v2) is the south and the movement vector on image (v1) directs to the right in the rectangular image region, the movement direction vector (v3) based on those vectors, directs to the west.

The movement destination estimation unit 102 may estimate a range of movement destination after a predetermined time, according to the movement amount of the image-capturing target per unit time. The movement destination estimation unit 102 outputs the movement direction vector in real space (v3) to the selection unit 104. The movement destination estimation unit 102 may output the range of movement destination after the predetermined time to the selection unit 104. The movement destination estimation unit 102 may output a movement amount per unit time to the selection unit 104.

The selection unit 104 compares the image-capturing scope of each of the imaging devices 2 stored in the database 6 with the movement direction vector in real space (v3) of the image-capturing target using as reference the position information of the imaging device 2 that is the transmission source. Based on the comparison, the selection unit 104 selects one or more second imaging devices 2 having an image-capturing scope covering the area that the movement direction vector (v3) points to (Step S104). The imaging device 2 thus selected is an imaging device 2 (a second imaging device 2) that is likely to capture the image-capturing target in the future when the imaging device 2 that is the transmission source of the image-capturing data including the images on which the image-capturing target is depicted can no longer capture the image-capturing target due to a movement of the image-capturing target, which may be a human or the like. The selection unit 104 detects the imaging device ID of the selected second imaging device 2 from the imaging device information stored in the database 6. The selection unit 104 outputs the imaging device ID of the selected second imaging device 2 to the band control request unit 105.

Note that the selection unit 104 may select an imaging device 2 by using, in addition to the movement direction vector (v3), the range of movement destination after a predetermined time or the movement amount of the image-capturing target per unit time. For example, the selection unit 104 determines whether or not the range of movement destination after a predetermined time overlaps the image-capturing scope of the second imaging device 2. The predetermined time may be calculated based on the movement amount per unit time. For example, the predetermined time is shorter for a greater movement amount per unit time while the predetermined time is longer for a smaller movement amount per unit time. The selection unit 104 may estimate the range in which the image-capturing target is located based on the movement amount of the image-capturing target per unit time, and select one or more imaging devices 2 from among the second imaging devices 2 belonging to the range. The selection unit 104 may end the processing when the second imaging device 2 cannot be selected. Alternatively, when the selection unit 104 cannot select the second imaging device 2, the image analyzer 1 may perform control to give a command that a person wearing a wearable camera or a drone equipped with an imaging device 2 should move to the image-capturing target such as a person captured by the first imaging device 2.

The band control request unit 105 transmits to the network control device 3 an increase request to increase the data transmission volume per unit time, the increase request including the imaging device ID of the selected imaging device 2 (Step S105). The network control device 3 outputs the imaging device ID included in the increase request as well as the increase request to the relay device 5. In response to the increase request, the relay device 5 overwrites the data transmission volume per unit time stored in the relay device 5, regarding the imaging device 2 indicated by the imaging device ID, with an increased data transmission volume. Thus, the relay device 5 can increase the data transmission volume per unit time of the image-capturing data allowed for the imaging device 2 that is likely to capture the image-capturing target at the movement destination of the image-capturing target.

According to the above-described processing, the image analyzer 1 and the image analysis system 100 including the image analyzer 1 increase in advance the transmission volume of the image-capturing data per unit time allowed for the imaging device 2 having an image-capturing scope covering the position estimated to be the movement destination of the image-capturing target before the image-capturing target moves thereto. When an imaging device 2, having captured the image-capturing target such as a suspicious person, tries to change the image quality of the image-capturing data to a high image quality and transmit the image to the image analyzer 1 immediately after the capture, a network congestion due to the limited transmission volume per unit time may occur. In such a case, the image analyzer 1 may not be able to receive the image-capturing data of high image quality transmitted by the imaging device 2 but the above-described processing can solve such a problem.

Further, especially when the suspicious person is in a car or on a motorcycle, it is desirable to analyze the image-capturing data of high image quality depicting the face of the suspicious person with the image analyzer 1 but the suspicious person enters the image-capturing scope and exits the image-capturing scope in a short time. The imaging device 2, which normally delivers image-capturing data at a low image quality, cannot therefore deliver the image-capturing data of high image quality. However, the image analyzer 1 according to the present example embodiment can solve such a problem by the above-described processing.

Note that, in selecting the second imaging device 2 having an image-capturing scope covering the movement destination of the image-capturing target, the image analyzer 1 may select the second imaging device 2 by further using information other than the movement direction of the image-capturing target and the position information of the movement destination. For example, it is assumed that a plurality of imaging devices 2 are respectively provided for patrol cars. In such a case, the image analyzer 1 further determines the degree of the congestion of the road. The image analyzer 1 may determine the degree of the congestion by any technique. When the image analyzer 1 determines that the degree of the congestion of the road is equal to or more than a predetermined degree, the image analyzer 1 selects based on the positions of the imaging devices 2 and the position of the movement destination of the suspicious vehicle that is the image-capturing target, one or more predetermined imaging devices 2 installed by the roadside. The image analyzer 1 then controls the data transmission volume so as to increase the transmission volume of the image-capturing data per unit time allowed to the imaging devices 2. Thus, the image analyzer 1 can select an imaging device 2 taking into consideration not only the position information but also the degree of the congestion on the road.

Further, the image analyzer 1 may select an imaging device 2 according to the purpose of using the image-capturing data to be analyzed. For example, when a suspicious person is detected in the image-capturing data obtained from a fixed imaging device 2, the image analyzer 1 may select a second imaging device 2 from among mobile imaging devices 2 (wearable cameras and drones) in order to obtain more information on the suspicious person (clearer facial image, license number plate of the car, and the like). Further, when the information for predicting a movement vector of the suspicious person is not sufficient, the image analyzer 1 may select an imaging device 2 from an expanded selection range of the imaging devices 2 or may select a mobile imaging device 2 in order to grasp geography of the neighborhood and monitor the movement line of the suspicious person.

When the monitor 7 included in the above-described image analysis system 100 receives from the relay device 5 the image-capturing data produced by the imaging device 2, the monitor 7 can output the received image or video. For example, the administrator designates an imaging device 2 and the monitor 7 outputs the image or video from the designated imaging device 2. The monitor 7 may be, for example, a mobile terminal such as a mobile phone, a tablet terminal, a personal computer, and the like. Further, the monitor 7 may receive from the image analyzer 1 the information on the movement direction vector (v3) and the movement destination determined by the image analyzer 1 and display the information. Further, the image analyzer 1 may output information of an image to the monitor 7, the image being a map image with the icons of a plurality of imaging devices 2 indicated thereon, wherein the icon image of the imaging device 2 selected based on the movement destination of the image-capturing target blinks or is displayed in a larger size. Note that the monitor 7 may display past videos and videos from imaging devices 2 other than those from the imaging device 2 selected by the image analyzer 1, in accordance with the operation by the user.

When a predetermined time has passed after the transmission of a request to increase the data transmission volume per unit time to the network control device 3, the band control request unit 105 of the image analyzer 1 may transmit a decrease request to restore the data transmission volume per unit time to the previous volume. The bandwidth allocated to the imaging device 2 can thus be decreased when the imaging device 2 is not capturing the desired image-capturing target. The band control request unit 105 of the image analyzer 1 may transmit a decrease request to restore the data transmission volume per unit time to the previous volume to the imaging device 2 having the increased data transmission volume allowance when it is detected that a suspicious person has gone out of the image-capturing scope based on the image data obtained from the imaging device 2, or when an instruction from the user has been obtained. The band control request unit 105 may have a function of restoring the data transmission volume per unit time to the previous volume when a return condition as described above is met.

Instead of calculating the movement direction vector (v3) of the image-capturing target on its own, the image analyzer 1 may obtain a movement direction vector (v3) from another device and based on that information, select an imaging device 2 considered to be at the movement destination of the image-capturing target.

Although the above-described processing concerns a case in which the image analyzer 1 detects the image-capturing target depicted on an image in the image-capturing data, an imaging device 2 or other device may detect the image-capturing target on an image.

Figure 9:
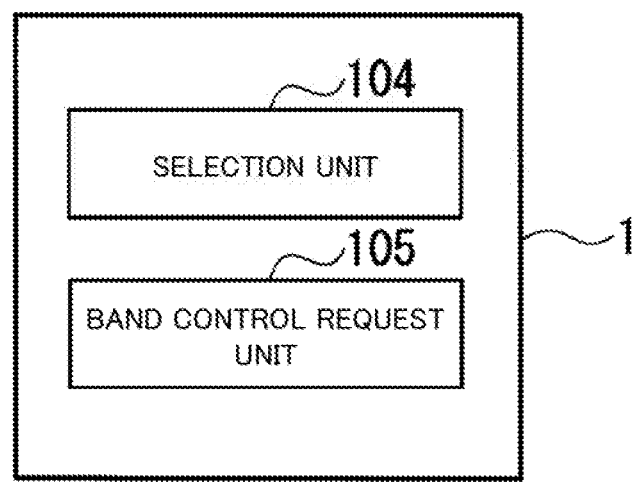
FIG. 9 is a diagram illustrating an example of a minimum configuration of the image analyzer.

FIG. 9 is a diagram illustrating a minimum configuration of the image analyzer.

As illustrated in this drawing, the image analyzer 1 needs only to include functions of the selection unit 104 and the band control request unit 105. The selection unit 104 selects a second imaging device relating to a first imaging device from among a plurality of imaging devices. The band control request unit 105 transmits to the network control device 3 an alteration request to alter the data transmission volume authorized for the second imaging device.

The above-described devices include computer systems inside. Computer programs for causing the devices to execute the above-described processing are stored in computer-readable storage media of the devices. The computers of the devices read and execute the computer programs, thereby carrying out the above-described processing. The computer-readable storage medium herein refers to a magnetic disc, a magneto-optical disc, a compact disc-read only memory (CD-ROM), a digital versatile disc-read only memory (DVD-ROM), a semiconductor memory, and the like. Further, the computer programs may be delivered to the computers via communication lines, and the computers upon receiving the programs may execute the programs.

The above-described computer programs may be for implementing a part of the functions of the above-described functional units. Further, the computer programs may be so-called differential files (differential programs) that allow the above-described functions to be implemented when combined with computer programs already stored in the computer systems.

The above-described example embodiments can be partially or entirely described as in the Supplemental note below but are not limited thereto.

Supplemental Note 1

An analyzer includes:
a selection unit that selects a second imaging device relating to a first imaging device from among a plurality of imaging devices; and
a band control request unit that transmits to a network control device an alteration request to alter a data transmission volume authorized for the second imaging device.

Supplemental Note 2

The analyzer according to supplemental note 1, further includes
a movement destination estimation unit that estimates a movement destination of an image-capturing target based on a movement direction of the image-capturing target depicted in image-capturing data received from the first imaging device,
wherein the selection unit selects the second imaging device based on an estimation result of the movement destination of the image-capturing target.

Supplemental Note 3

In the analyzer according to supplemental note 1 or 2, wherein the analyzer updates position information of the imaging device stored in the analyzer based on information transmitted from the first imaging device or the second imaging device.

Supplemental Note 4

In the analyzer according to any one of supplemental notes 1 to 3, wherein the band control request unit transmits to the network control device an increase request, as the alteration request, to increase a data transmission volume per unit time authorized for the second imaging device.

Supplemental Note 5

In the analyzer according to supplemental note 4, wherein, after transmitting the increase request to the network control device, the band control request unit transmits to the network control device a decrease request to decrease the data transmission volume per unit time to the volume before the transmission of the increase request.

Supplemental Note 6

The analyzer according to supplemental note 2, further includes
an image-capturing scope calculation unit that calculates respective image-capturing scopes of the imaging devices based on position information of the imaging devices and image-capturing directions of the imaging devices,
wherein, based on the estimation result of the movement destination of the image-capturing target, the selection unit selects the second imaging device of which the image-capturing scope covers the movement destination of the image-capturing target.

Supplemental Note 7

An analysis system includes:
a plurality of image-capturing unit that transmits image-capturing data;
a selection unit that selects a second image-capturing unit relating to a first image-capturing unit from among the plurality of image-capturing unit; and
an analyzing unit that transmits an alteration request to alter a data transmission volume authorized for the second image-capturing unit.

Supplemental Note 8

The analysis system according to supplemental note 7, further includes
a movement destination estimation unit that estimates a movement destination of an image-capturing target based on a movement direction of the image-capturing target depicted in image-capturing data received from the first image-capturing unit,
wherein the analyzing unit selects the second image-capturing unit based on an estimation result of the movement destination of the image-capturing target.

Supplemental Note 9

An analysis method includes:
selecting a second imaging device relating to a first imaging device from among a plurality of imaging devices; and
transmitting to a network control device an alteration request to alter a data transmission volume authorized for the second imaging device.

Supplemental Note 10

A program storage medium stores a computer program that causes a computer of an analyzer to function as:
 a selection unit that selects a second imaging device relating to a first imaging device from among a plurality of imaging devices; and
 a band control request unit that transmits to a network control device an alteration request to alter a data transmission volume authorized for the second imaging device.

Supplemental Note 11

An analyzer includes:
 a selection unit that selects a second imaging device relating to a first imaging device capturing an image-capturing target from among a plurality of imaging devices in accordance with a selection rule established in advance; and
 a band control request unit that transmits to a network control device that controls data traffic in a network an alteration request to altering a data transmission volume authorized for the second imaging device.

Supplemental Note 12

The analyzer according to supplemental note 11, further includes
 a movement destination estimation unit that estimates a movement destination of an image-capturing target based on a movement direction of the image-capturing target depicted in image-capturing data received from the first imaging device,
 wherein the selection rule provides that the imaging device capturing the movement destination of the image-capturing target is selected as the second imaging device.

Supplemental Note 13

The analyzer according to supplemental note 11 or 12, further includes:
 a configuration for storing position information of the imaging devices; and
 a configuration for updating the stored position information of the imaging devices based on information transmitted from the first imaging device or the second imaging device.

Supplemental Note 14

In the analyzer according to any one of supplemental notes 11 to 13, wherein the band control request unit transmits to the network control device an increase request, as the alteration request, to increase a data transmission volume per unit time authorized for the second imaging device.

Supplemental Note 15

In the analyzer according to supplemental note 14, wherein the band control request unit further includes a configuration to transmit to the network control device a decrease request to restore the data transmission volume per unit time to the volume before the transmission of the increase request when a return condition established in advance is met after the transmission of the increase request to the network control device.

Supplemental Note 16

The analyzer according to supplemental note 12, further includes
 an image-capturing scope calculation unit that calculates image-capturing scopes of the imaging devices based on position information of the imaging devices and image-capturing direction information of the imaging devices,
 wherein the selection rule provides that an imaging device of which the calculated image-capturing scope covers the estimated movement destination of the image-capturing target is selected as the second imaging device.

Supplemental Note 17

An analysis system includes:
 a plurality of imaging devices that transmit image-capturing data; and
 an analyzer comprising:
  a selection unit that selects a second imaging device relating to a first imaging device capturing an image-capturing target from among the plurality of imaging devices in accordance with a selection rule to established in advance; and
  a band control request unit that transmits to a network control device that controls data traffic in a network an alteration request to alter a data transmission volume authorized for the second imaging device.

Supplemental Note 18

The analysis system according to supplemental note 17, further includes
 a movement destination estimation unit that estimates a movement destination of the image-capturing target based on a movement direction of the image-capturing target depicted in image-capturing data received from the first imaging device,
 wherein the selection rule provides that the imaging device capturing the movement destination of the image-capturing target is selected as the second imaging device.

Supplemental Note 19

An analysis method includes:
 selecting a second imaging device relating to a first imaging device capturing an image-capturing target from among a plurality of imaging devices in accordance with a selection rule established in advance; and
 transmitting to a network control device that controls data traffic in a network an alteration request to alter a data transmission volume authorized for the second imaging device.

Supplemental Note 20

A program storage medium stores a computer program that causes a computer to execute:
 selecting a second imaging device relating to a first imaging device capturing an image-capturing target from among a plurality of imaging devices in accordance with a selection rule established in advance; and
 transmitting to a network control device that controls data traffic in a network an alteration request to alter a data transmission volume authorized for the second imaging device.

The present invention has been described using the above-described example embodiments as exemplary examples. However, the present invention is not limited to the above-described example embodiments. In other words, the various aspects that a person skilled in the art can understand can be applied to the present invention within the scope of the present invention.

REFERENCE SIGNS LIST 1 image analyzer
2 imaging device
3 network control device
4 base station
5 relay device
6 database
7 monitor
101 control unit
102 movement destination estimation unit
103 image-capturing scope calculation unit
104 selection unit
105 band control request unit

The invention claimed is:

1. An analysis system comprising:
at least one processor configured to:
selecta second imaging device relating to a first imaging device capturing an image-capturing target from among a plurality of imaging devices in accordance with a selection rule established in advance, the selection rule being a rule related to movement of the image-capturing target, the plurality of imaging devices being in an area within a range where size is determined using information about movement of the image-capturing target, the area being set in order to select the second imaging device; and
transmit to a network control device an alteration request to alter a data transmission volume per unit time authorized for the second imaging device, the network control device being configured to control data traffic in a network.

2. The analysis system according to claim 1, wherein the at least one processor is further configured to
estimate a movement destination of the image-capturing target based on a movement direction of the image-capturing target depicted in image-capturing data received from the first imaging device, and
wherein the selection rule further provides that the imaging device capturing the movement destination of the image-capturing target is selected as the second imaging device.

3. The analysis system according to claim 2, wherein the at least one processor is further configured to
calculate image-capturing scopes of the imaging devices based on position information of the imaging devices and image-capturing direction information of the imaging devices, and
wherein the selection rule further provides that the imaging device of which the calculated image-capturing scope covers the estimated movement destination of the image-capturing target is selected as the second imaging device.

4. The analysis system according to claim 1, wherein the at least one processor is further configured to:
store position information of the imaging devices; and
update the stored position information of the imaging devices based on information transmitted from the first imaging device or the second imaging device.

5. The analysis system according to claim 1, wherein the processor transmits to the network control device an increase request, as the alteration request, to increase the data transmission volume per unit time authorized for the second imaging device.

6. The analysis system according to claim 5, wherein the processor is further configured to transmit to the network control device a decrease request to restore the data transmission volume per unit time to the volume before transmission of the increase request when a return condition established in advance is met after the transmission of the increase request to the network control device.

7. An analysis method comprising:
by at least one processor,
selecting a second imaging device relating to a first imaging device capturing an image-capturing target from among a plurality of imaging devices in accordance with a selection rule established in advance, the selection rule being a rule related to movement of the image-capturing target, the plurality of imaging devices being in an area within a range where size is determined using information about movement of the image-capturing target, the area being set in order to select the second imaging device; and
transmitting to a network control device an alteration request to alter a data transmission volume per unit time authorized for the second imaging device, the network control device being configured to control data traffic in a network.

8. A non-transitory program storage medium storing a computer program that causes a computer to execute:
selecting a second imaging device relating to a first imaging device capturing an image-capturing target from among a plurality of imaging devices in accordance with a selection rule established in advance, the selection rule being a rule related to movement of the image-capturing target, the plurality of imaging devices being in an area within a range where size is determined using information about movement of the image-capturing target, the area being set in order to select the second imaging device; and
transmitting to a network control device an alteration request to alter a data transmission volume per unit time authorized for the second imaging device, the network control device being configured to control data traffic in a network.

* * * * *